(12) United States Patent
Halstvedt et al.

(10) Patent No.: US 7,900,106 B2
(45) Date of Patent: Mar. 1, 2011

(54) ACCESSING SEQUENTIAL DATA IN A MICROCONTROLLER

(75) Inventors: Andreas Engh Halstvedt, Trondheim (NO); Kai Kristian Amundsen, Trondhiem (NO); Frode Milch Pedersen, Trondheim (NO)

(73) Assignee: ATMEL Corporation, San Jose, CA (US)

( * ) Notice: Subject to any disclaimer, the term of this patent is extended or adjusted under 35 U.S.C. 154(b) by 366 days.

(21) Appl. No.: 12/057,794

(22) Filed: Mar. 28, 2008

(65) Prior Publication Data

US 2009/0249136 A1 Oct. 1, 2009

(51) Int. Cl.
  *G01R 31/28* (2006.01)
  *G01R 31/26* (2006.01)
  *G11C 29/00* (2006.01)
(52) U.S. Cl. ......... 714/727; 714/718; 714/726; 714/729; 365/201; 324/763; 324/765
(58) Field of Classification Search .................. 714/718, 714/726, 727, 729; 365/201; 324/763, 765
See application file for complete search history.

(56) References Cited

U.S. PATENT DOCUMENTS

| | | | | |
|---|---|---|---|---|
| 5,590,354 A | * | 12/1996 | Klapproth et al. | 714/30 |
| 5,996,091 A | * | 11/1999 | Jones et al. | 714/37 |
| 6,243,842 B1 | * | 6/2001 | Slezak et al. | 714/724 |
| 6,601,189 B1 | * | 7/2003 | Edwards et al. | 714/30 |
| 6,675,334 B2 | | 1/2004 | Wadley | |
| 6,925,583 B1 | * | 8/2005 | Khu et al. | 714/30 |
| 6,938,191 B2 | * | 8/2005 | Sato et al. | 714/703 |
| 6,948,147 B1 | * | 9/2005 | New et al. | 716/16 |
| 7,075,331 B2 | * | 7/2006 | Pail et al. | 326/38 |
| 7,451,367 B2 | * | 11/2008 | Pedersen | 714/718 |
| 2005/0097518 A1 | | 5/2005 | Larson et al. | |
| 2005/0102574 A1 | | 5/2005 | Larson et al. | |
| 2005/0120269 A1 | | 6/2005 | Larson et al. | |
| 2007/0192657 A1 | * | 8/2007 | Laurent et al. | 714/720 |
| 2007/0208967 A1 | | 9/2007 | Pedersen | |

OTHER PUBLICATIONS

Ashfield, E. et al., "Serial Wire Debug and the CoreSight™ Debug and Trace Architecture", ARM Ltd, Cambridge, UK, 8 pages.

* cited by examiner

*Primary Examiner* — John J Tabone, Jr.
(74) *Attorney, Agent, or Firm* — Fish & Richardson P.C.

(57) ABSTRACT

System and methods transfer data over a microcontroller system test interface. The system can read data from and write data to microcontroller system memory using the described method. The method provides for the efficient transfer of data, minimizing redundancies and overhead present in conventional microcontroller test system protocols.

21 Claims, 13 Drawing Sheets

ACCESSING SEQUENTIAL DATA IN A MICROCONTROLLER

TECHNICAL FIELD

The present disclosure is generally related to electrical device testing.

BACKGROUND

Advances in surface mount technology and printed circuit board (PCB) manufacture have resulted in more complex and smaller PCBs that have higher integrated circuit (IC) density. Surface mount devices (SMDs) and very large-scale integrated (VLSI) circuits often have minimal spacing between pins and some PCBs include SMDs mounted to both sides, which further increases board complexity. Contact test methods for such devices (in which the test fixture directly contacts the pins or other electrical contacts on a PCB) have become correspondingly more complex and costly. In order to test devices with higher pin pitches, test fixtures utilize ever smaller probe tips or alternative electrical contact apparatus, and similarly, testing of devices having ICs mounted on both sides of a PCB can require substantial modification of pre-existing test fixtures.

In 1990, the Institute of Electrical and Electronic Engineers (IEEE) adopted a standard for a non-contact method of testing PCBs named the IEEE Standard Test Access Port and Boundary Scan Architecture. The standard, designated IEEE 1149.1, is also commonly referred to as the Joint Test Action Group (JTAG) standard or just JTAG. JTAG logic can be incorporated into an IC that implements test methods including in-circuit testing of an IC itself, testing of connections between ICs in an assembled PCB, and operational testing for observing and modifying circuit activity during normal operation. The test logic permits software control and observation of boundary scan cells. Boundary scan cells are cells located adjacent to respective IC pins that permit signals at the IC boundaries to be controlled and observed, and each boundary scan cell can include a shift register stage. The boundary scan cells permit test data to be placed at an output and/or input pin of an IC without the need for a physical probe. The boundary scan cells of an IC can be interconnected to form a shift register chain that can include serial input and output connections and clock and control signals. Test data can be shifted serially into and out of boundary scan registers connected to a bus within the IC. The boundary scan bus can be accessed through a Test Access Port (TAP).

Conventionally, the TAP controls an interface between the boundary scan registers on the IC and a boundary scan bus. The TAP can be, for example, a state machine controlling the operations associated with the boundary scan cells. A conventional TAP controller interface is based on four ports. The Test Clock (TCK), Test Mode Select (TMS), Test Data In (TDI), and Test Data Out (TDO) ports of a TAP controller can be used to control the basic operation of the TAP. The TCK and TMS ports can direct signals between TAP controller states. The TDI and TDO ports can receive the data input and output values serially from the boundary scan registers. An optional fifth port, Test Reset (TRST), can be implemented as an asynchronous reset signal to the TAP controller.

A JTAG device (e.g., an external test device) can communicate with a TAP controller using a JTAG serial protocol for full duplex serial synchronous communication with the TAP controller. A JTAG master that forms part of the JTAG device, and a JTAG TAP controller can include logic for accessing the internal memory in a microcontroller.

SUMMARY

The described systems and methods permit a sequential block of data to be efficiently written to or read from a microcontroller system during testing and/or debugging. Control logic of a microcontroller system testing interface is adapted to recognize an instruction for transferring a sequential block of data. In some implementations, the control logic, upon receiving the instruction, is adapted to transfer a number M of data words while a state machine of the testing interface remains in a single state. In some implementations, the testing interface is a JTAG testing interface that has been adapted to recognize the sequential block data transfer instruction. Control logic of the JTAG testing interface transfers an indicated block size of data using conventional JTAG registers while a JTAG state machine of the testing interface remains in a Shift-DR state.

DETAILED DESCRIPTION

Example Debugging System Using Sequential Data Access

Figure 1:
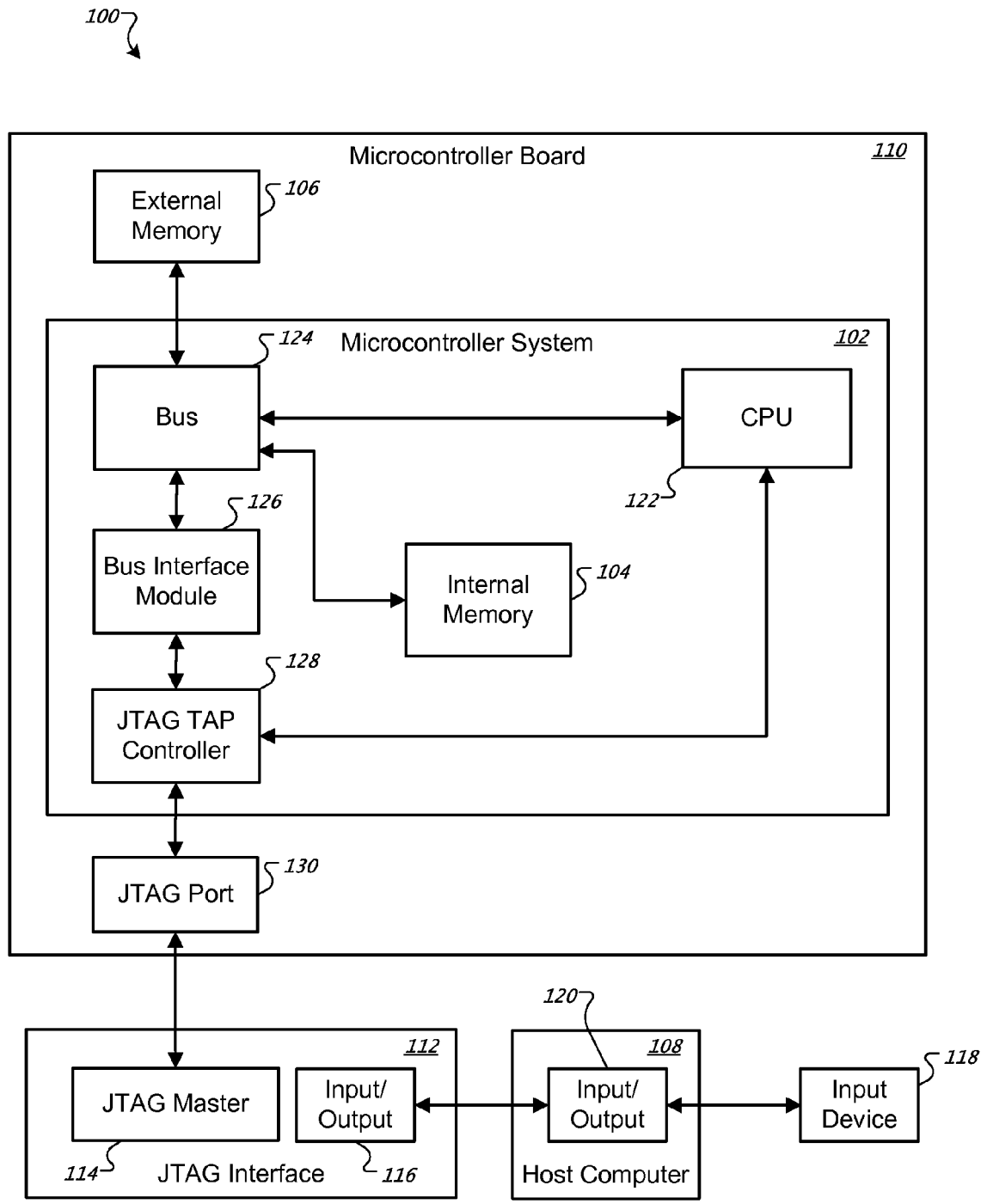
FIG. 1 is a block diagram of an example computer system configured for debugging a microcontroller based system.

FIG. 1 is a block diagram of an example computer system 100 configured for debugging a microcontroller based system 102. As shown in FIG. 1, the example computer system 100 includes a host computer 108 connected to a microcontroller board 110 via a JTAG interface 112. The JTAG interface 112 can include a JTAG master 114 and an input/output port 116. The JTAG master 114 can control communications between the JTAG interface 112 and a JTAG TAP controller 128 included in the microcontroller system 102. The JTAG master 114 can interpret commands received from the host computer 108 and convert them to the signals and instructions used to send data to the JTAG port 130 to control the JTAG TAP controller 128.

A user of the debugging system 100 can operate the microcontroller board 110 using an input device 118 connected to an input/output port 120 of the host computer. The user can input control data using the input device 118. The input/output port 120 on the host computer 108 can be connected to the input/output port 116 on the JTAG interface 112 to allow data to be transferred from the host computer 108 to the JTAG interface 112. In some implementations, the input device 118 and the host computer 108 can be a single device (e.g., laptop computer).

A user can enter a command using, for example, the keyboard of the input device 118. The command can be processed by an application running on the host computer 108, resulting in the transmission of an instruction from the input/output port 120 to the input/output port 116 of the JTAG interface 112. Communication between the input/output port 120 and the input/output port 116 can occur over interfaces that can include, but are not limited to, a full duplex serial-based communication interface (e.g., an RS-232 or universal serial bus (USB) connection), a parallel-based communication interface (e.g., a parallel bidirectional port, etc.), a network-based communication interface (e.g., Ethernet, etc.), and a wireless-based communication interface (e.g., Bluetooth, etc.). An instruction received by the JTAG interface 112 is interpreted by the JTAG master 114, to determine the JTAG instructions, data, and signals to transmit to a JTAG port 130 on the microcontroller board 110.

As shown in FIG. 1, the microcontroller board 110 includes the microcontroller system 102, the external memory 106, and the JTAG port 130. The microcontroller system 102 includes a central processing unit (CPU) 122, a bus 124, a bus interface module 126, and a JTAG TAP controller 128. The JTAG signals transmitted from the JTAG master 114 to the JTAG port 130 can include TCK, TDO, TDI, and TMS. Optionally, a TRST signal can also be transmitted by the JTAG master 114.

A state machine included in the JTAG TAP controller 128, described in more detail below, can control the operation of the JTAG TAP controller 128. The JTAG TAP controller 128 can interface with the CPU 122 and the bus interface module 126. The JTAG interface 112, using the JTAG port 130 to access the JTAG TAP controller 128, can provide the host computer 108 with access to one or more registers of the CPU 122. The JTAG TAP controller 128 can also interface with the bus interface module 126 to allow the host computer to access internal memory 104 and external memory 106.

In some implementations, the internal memory 104 can include, but is not limited to, an Electrically Erasable and Programmable Read Only Memory (EEPROM) for instruction storage and Dynamic Random Access memory (DRAM) for data storage. In some implementations, the internal memory 104 includes Flash memory and Static Random Access Memory (SRAM). In some implementations, the external memory 106 includes EEPROMS, DRAM, Flash memory, and SRAM.

The CPU 122 can provide core logic and control for the microcontroller system 102, and can interface with the bus 124 to access the internal memory 104, the external memory 106, and the bus interface module 126.

The bus interface module 126 can include logic for accessing sequential data in internal memory 104 or external memory 106. The bus can access the data to, for example, read and/or write a sequential block of memory in internal memory 104 or external memory 106.

JTAG TAP Controller State Diagram

Figure 2:
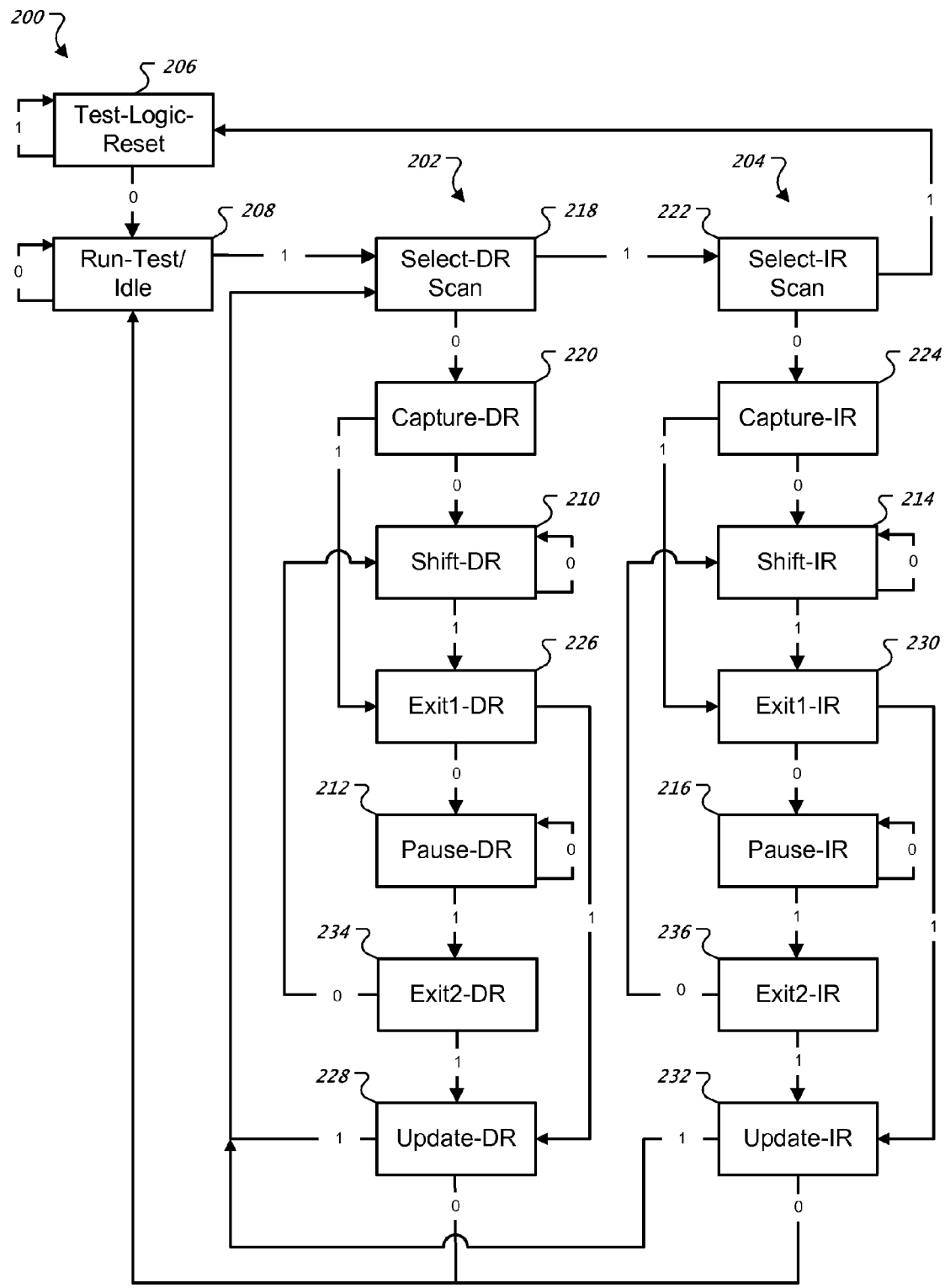
FIG. 2 is a state diagram of the JTAG TAP controller of FIG. 1.

FIG. 2 is a state diagram 200 of the JTAG TAP controller 128 of FIG. 1. The state diagram 200 illustrates an example state machine that includes state transitions controlled by the TMS signal and driven by the TCK signal. In some implementations, each state has two exits and transitions are controlled by the TMS signal.

In some implementations, the state machine includes six ready states: Test-Logic-Reset state 206, Run-Test/Idle state 208, Shift-DR state 210, Pause-DR state 212, Shift-IR state 214, and Pause-IR state 216. The Test-Logic-Reset state 206 is the steady state condition that exists when TMS is set high (i.e., set to 1).

The JTAG TAP controller 128 can be placed into the Test-Logic-Reset state 206 at, for example, power up or during normal operation of the microcontroller system 102. The Test-Logic-Reset state can be reached, for example, upon the TMS input being set high during five or more TCKs. In this state, the JTAG TAP controller 128 can issue a reset signal that places all test logic in a condition that does not impede normal operation of the microcontroller system 102. A test mode can be entered by way of the TMS input signal and the TCK signal causing the JTAG TAP controller to exit the Test-Logic-Reset state 206 and enter the Run-Test/Idle state 208. An instruction register (IR) scan can be initiated by transitioning the JTAG TAP controller 128 through the instruction register path 204 from the Run-Test/Idle state 208. A data register (DR) scan can also be initiated by transitioning through the data register path 202 from the Run-Test/Idle state 208.

The data register path 202 is entered, for example, though a Select-DR Scan state 218, transitioning to a Capture-DR state 220. The instruction register path is entered by, for example, transitions through the Select-DR Scan state 218 and a Select-IR Scan state 220 to a Capture-IR state 224.

An operation can include a transition path through the data register path 202 and instruction register path 204. The value of a currently selected data register can be captured upon entry to the Capture-DR state 220. A new value can be shifted into the currently selected data register from the TDI line one bit at a time, for example, upon entry to the Shift-DR state 210. The old value of the currently selected data register can be shifted out to the TDO line one bit at a time, for example, upon exits from the Shift-DR state 210. The JTAG TAP controller 128 transitions to an Exit1-DR state 226 when, for example, shifting is complete. In the case of the boundary scan register, the value of the currently selected data register can be transferred to the output pins, for example, upon entry to an Update-DR state 228 after exiting the Exit1-DR state 226. The JTAG TAP controller 128 can then transition to the Run-Test/Idle state 208 terminating the operation.

The value of the instruction register that will be shifted out can be captured upon entry into the Capture-IR state 224. The old value can be shifted out, one bit at a time, for example, upon entries to the Shift-IR state 214. In some implementations, the value captured by the shift register in Capture-IR is a status code, or a fixed value, as defined by the JTAG standard. The new value can be shifted into the instruction register, one bit at a time, for example, upon exits to the Shift-IR state 214. The JTAG TAP controller 128 transitions to an Exit1-IR state 230 when complete. The new value shifted into the instruction register can be applied and the instruction can take effect upon entry into an Update-IR state 232. The JTAG TAP controller 128 then transitions to the Run-Test/Idle state 208 terminating the operation.

A pause state can be entered to temporarily suspend the shifting of data through the selected data register, in the case of Pause-DR 212, or the instruction register, in the case of Pause-IR 216. A pause state can be entered while an operation is performed, refilling a memory buffer, for example. In the case of the data register path 202, shifting can resume from the Pause-DR state 212 by way of an Exit2-DR state 234. Shifting can also be ended by way of the Exit2-DR state 234 and the Update-DR state 228. The Update-DR state 228 then transitions to the Run-Test/Idle state 208. In the case of the instruction register path 204, shifting can resume from the Pause-IR 216 state by way of an Exit2-IR state 236. Shifting can also be ended by way of the Exit2-IR 236 state and the Update-IR state 232. The Update-IR state 232 then transitions to the Run-Test/Idle state 208.

Overview of a Sequential Data Access/Transfer Operation

A conventional JTAG instruction set can be extended to include an instruction for providing efficient access to a sequential block of data in a microcontroller-based system. This JTAG instruction is referred to herein as MEMORY_STREAM_ACCESS. This instruction provides for the transfer of sequential data of arbitrary length into or out of memory included in, or controlled by, a microcontroller based system while a JTAG TAP controller remains in the Shift-DR state. The destination address information need not be transferred for individual words during the block transfer operation using MEMORY_STREAM_ACCESS. The resulting data transfer operation increases the data transfer rate over a JTAG interface without requiring added hardware complexity. Conventional bandwidth limitations can be overcome for transferring large amounts of sequential data through a JTAG interface while using a practical implementation for the logic circuit of the JTAG master. This can provide less expensive, higher bandwidth JTAG-based programming and debugging tools for microcontroller based systems.

Initializing Data Transfer

Prior to performing a MEMORY_STREAM_ACCESS operation, an initializing data transfer can be performed using conventional JTAG instructions to initialize one or more registers for control of the MEMORY_STREAM_ACCESS operation. In some implementations, an address register, size register, and transfer direction register are initialized prior to issuing the MEMORY_STREAM_ACCESS instruction. The address register is initialized with the target memory address to or from which the data transfer is to occur. The size register is initialized with a value representing the word size of the data to be transferred (e.g., 8-bit, 16 bit, 32-bit, etc.) that can be set, for example, to match a bit size of internal and/or external memory of a microcontroller. The transfer direction register indicates whether the data transfer is to be to or from the microcontroller system 102.

Figure 3:
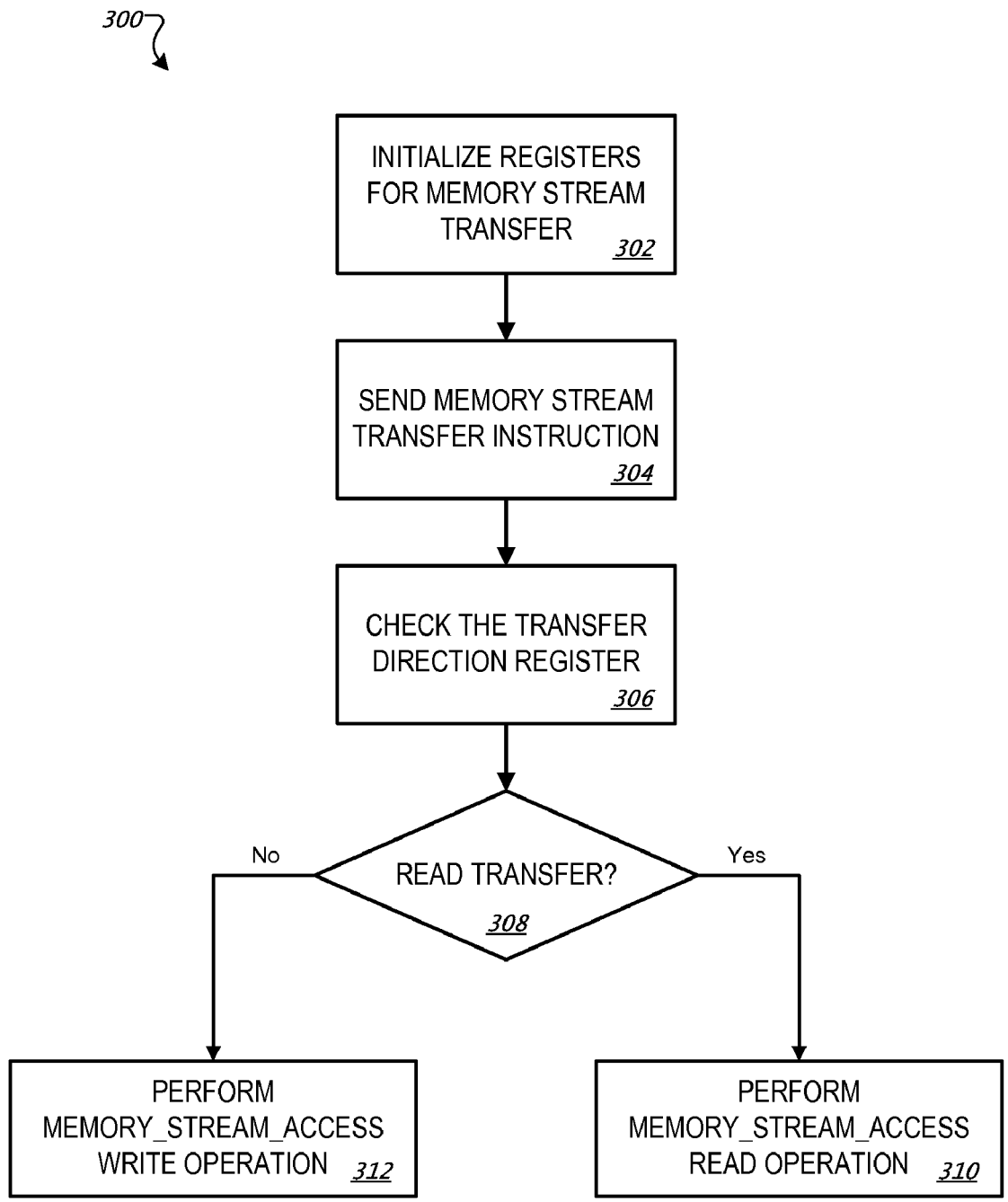
FIG. 3 is a flowchart of an example method for initializing a sequential data access.

FIG. 3 is a flowchart of an example method 300 for initializing a sequential data access. A size register, an address register, and a data register are embedded into control logic for implementing the method 300. The method 300 can perform an initializing transfer to load the address, size, and transfer data direction for a sequential data access prior to the start of the MEMORY_STREAM_ACCESS operation.

During MEMORY_STREAM_ACCESS operation, the JTAG master can perform sequential data access of memory internal or external to a microcontroller system. In some implementations, prior to issuing a MEMORY_STREAM_ACCESS instruction, the user can instruct the JTAG master to read or write one data packet to or from a specific memory location. The data packet can include the address of the start of the block of sequential data to transfer, the size of the words to transfer, and the transfer direction for the block of sequential data (e.g., read or write). The initializing transfer can use conventional instructions of the JTAG interface to load the address, size, and transfer direction registers for the MEMORY_STREAM_ACCESS instruction control.

In some implementations, the size of the block of sequential data can be in bytes (8-bits) where a word is one byte in length. A word size of 8-bits is used in some of the examples below, but in some implementations, the word size of the block of sequential data can be any number of bits (e.g., 16-bit, 32-bit, 64-bit, etc.).

The method 300 begins by performing an initializing transfer to initialize the registers in a JTAG TAP controller and a microcontroller system for a memory stream transfer using the MEMORY_STREAM_ACCESS instruction (302). For example, using a specific instruction, the JTAG master can read or write one packet of data to or from a specific memory location. A MEMORY_STREAM_ACCESS instruction is issued (e.g., by the JTAG master) (304). The transfer direction register is checked to determine if the data transfer is a read transfer or a write transfer (306). If the transfer is a read transfer (308), a MEMORY_STREAM_ACCESS read operation is performed (310). Otherwise a MEMORY_STREAM_ACCESS write operation is performed (312).

Write Operation

Figure 4:
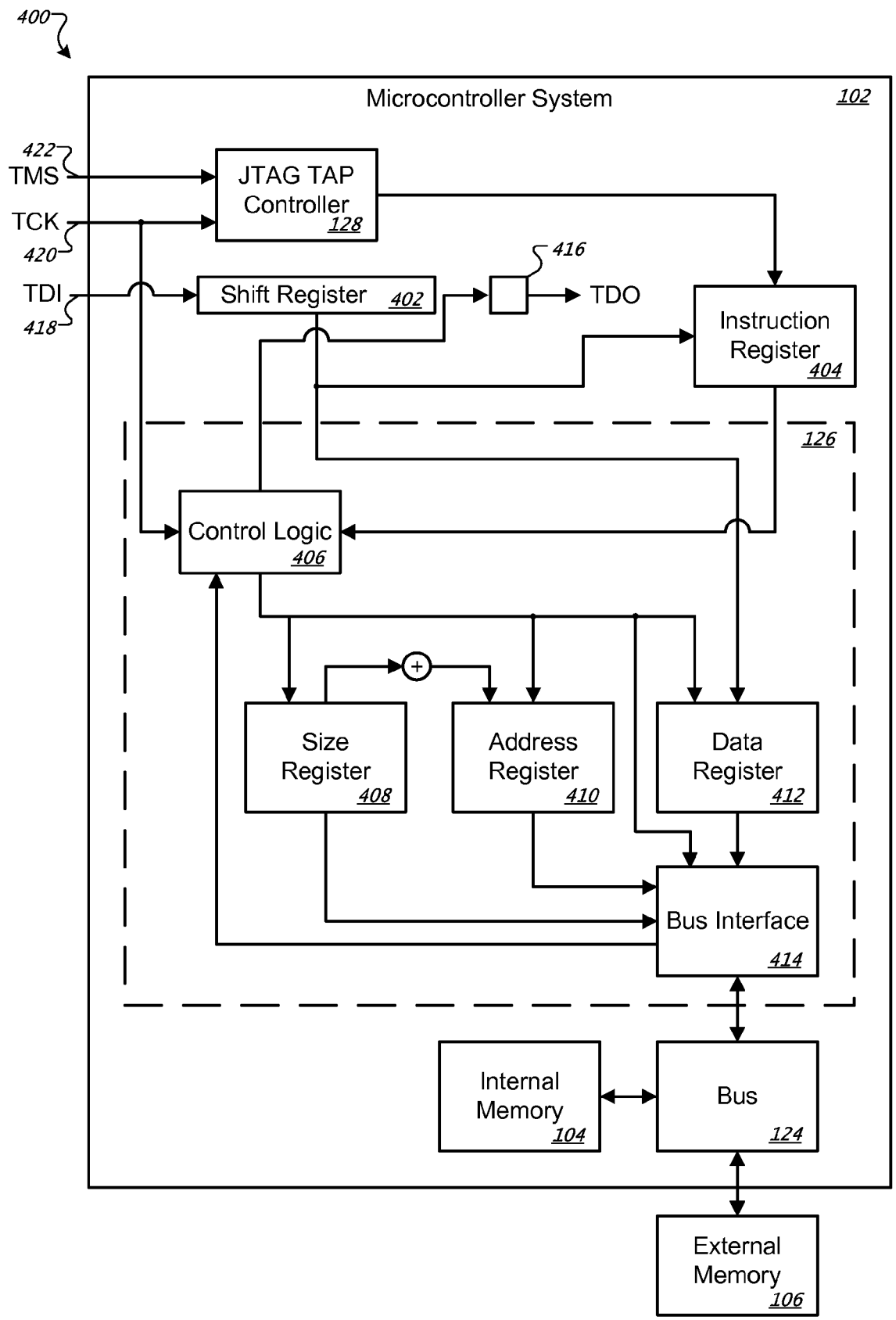
FIG. 4 is a block diagram of an example system used to write a block of sequential data in a microcontroller system.

FIG. 4 is a block diagram of an example system 400 used to write a block of sequential data in a microcontroller system 102. The system 400 shows an implementation of a JTAG bus interface for use with a MEMORY_STREAM_ACCESS instruction in write mode. The system 400 includes internal memory 104 and a bus 124. The bus 124 can also interface with external memory 106. The bus 124 controls the writing of data to both the internal memory 104 and the external memory 106. The value in the address register determines the memory block of internal memory 104 or external memory 106 to which data will be written.

The bus interface module 126 includes control logic 406, size register 408, address register 410, data register 412, and a bus interface 414. The control logic 406 can control operation of the MEMORY_STREAM_ACCESS instruction. As described in FIG. 3, an initializing transfer can occur prior to issuing a MEMORY_STREAM_ACCESS instruction. The initializing transfer loads the size register 408 with the size of the words to be written (e.g., 8-bit, 16-bit, 32-bit, etc.), loads the address register 410 with the starting address in memory where data is to be written, and loads a transfer direction register (not shown) to indicate a write (in this example) instruction will occur.

The system 400 includes the JTAG TAP controller 128, a shift register 402, TDO 416, and an instruction register 404. The JTAG TAP controller 128 includes a JTAG state machine such as described above, for example, with reference to FIG. 2. The shift register 402 can convert serial data input on TDI 418 to parallel data. In a write mode, this data can be transferred to the data register 412.

In the system 400, the JTAG state machine includes state transitions controlled by TMS 422 and driven by TCK 420. The system 400 can use TDI 418 and TDO 416 for serial access to the instruction register 404 or the data register 412 in the Shift-IR 214 and Shift-DR 210 states, respectively. The instruction register 404 can decode the MEMORY_STREAM_ACCESS instruction, as well as other instructions, that the system 400 can use to load the registers included in the bus interface module 126. Once the registers are loaded, the system 400 can perform the indicated bus transfer and report a status to the control logic 406, which can be output on TDO 416. In the case of the MEMORY_STREAM_ACCESS instruction in a write mode, the system 400 can report the status after writing, for example, each word to memory.

In some implementations, the system 400 can connect the shift register 402 to the data register 412 with N bits, where N is the size of a word, in bits, to be written to memory. When entering the Shift-DR state 210 of the JTAG state machine, the JTAG master can begin to transfer the first word to memory on TDI 418. Once the transfer of the entire word (N bits) is complete, the JTAG master can continue to transfer the next word to memory on TDI 418, without leaving the Shift-DR state 210 of the JTAG state machine.

The control logic 406 can initiate the transfer of the shift register 402 to the data register 412 for every word, or N bits. This transfer can start a memory write operation on the bus interface 414. The bus interface 414 can transfer the word to the bus 124, which can write it to internal memory 104 included in the microcontroller system 102. The bus 124 can write the word to the memory address provided to the bus interface 414 from the address register 410. The bus interface 414 will continue to transfer, on a word-by-word basis, the entire block of data to memory until it reaches the end of the block. The address register is incremented according to the value stored in the size register 408 (e.g., the address is incremented one byte for an 8-bit word size) as the write operation occurs.

The bus interface 414 can inform the control logic that a transfer is in progress, or that a transfer is complete. The control logic 406 can output the transfer status to TDO 416 for use by the JTAG master, count the number of TCK 420 cycles transferred, and activate data transfers at regular intervals according to the size of the data to be transferred.

The writing of the sequential block of data to memory continues until the bus 124 writes the last word. The JTAG master can leave the Shift-DR state 210 after transferring the last bit of the last word to TDI 418. Thus, during a MEMORY_STREAM_ACCESS operation, the JTAG master can use the data register 412 as an N*M bit shift register, where M is the number of words in the data transfer, as determined by operation of the JTAG master, and N is the number of bits per word, as indicated in the size register. The MEMORY_STREAM_ACCESS operation permits the data register 412 to be used as a virtual variable size shift register, having a size dependent on the number of words transferred and the bit size of each word.

Cached memory or memory accessed through the external memory interface of a microcontroller can, for example, have high latency. If the system 400 executes a MEMORY_STREAM_ACCESS instruction in a write mode using high latency memory, a previous memory access might not be complete by the time the system 400 receives new data for the next memory access. In this case, the system 400 can report the current status of the data transfer to the JTAG master. The control logic 406 can output the transfer status information it receives from the bus interface 414 on TDO 416 when the JTAG master transfers the last bit of the next word. Shifting the new data for the next word into the shift register 402 while the previous word in the data register 412 is written to memory allows the ongoing write operation additional time to complete before the next word write.

If the previous word write is still in progress after the JTAG master transfers N−1 bits of the new word into the shift register 402, the MEMORY_STREAM_ACCESS instruction reports a busy status. The system 400 reports the busy status to the JTAG master on TDO 416, and discards the last word transferred from the JTAG master and shifted into the shift register 402. A JTAG master supporting the MEMORY_STREAM_ACCESS instruction will respond to the busy status by retransmitting the current word on TDI 418. This process continues until the previous memory access completes on or before the time the JTAG master transfers the N−1 bit of the current word into the shift register 402.

A feedback mechanism can indicate the transfer status of each word by outputting a busy status on TDO 416 for use by the JTAG master. This reduces the need for the introduction of wait states in the JTAG protocol. The JTAG master can resend a word of data until the system 400 confirms the writing of the word into memory. During this time, the JTAG state machine need not change states and can remain in the Shift-DR state 210. The data transfer can run at high speed, with delays introduced only when necessary. Use of this feedback mechanism can be beneficial when memory access delays may be non-deterministic, as can be the case when using high latency memory.

Method for Writing a Block of Sequential Data

Figure 5:
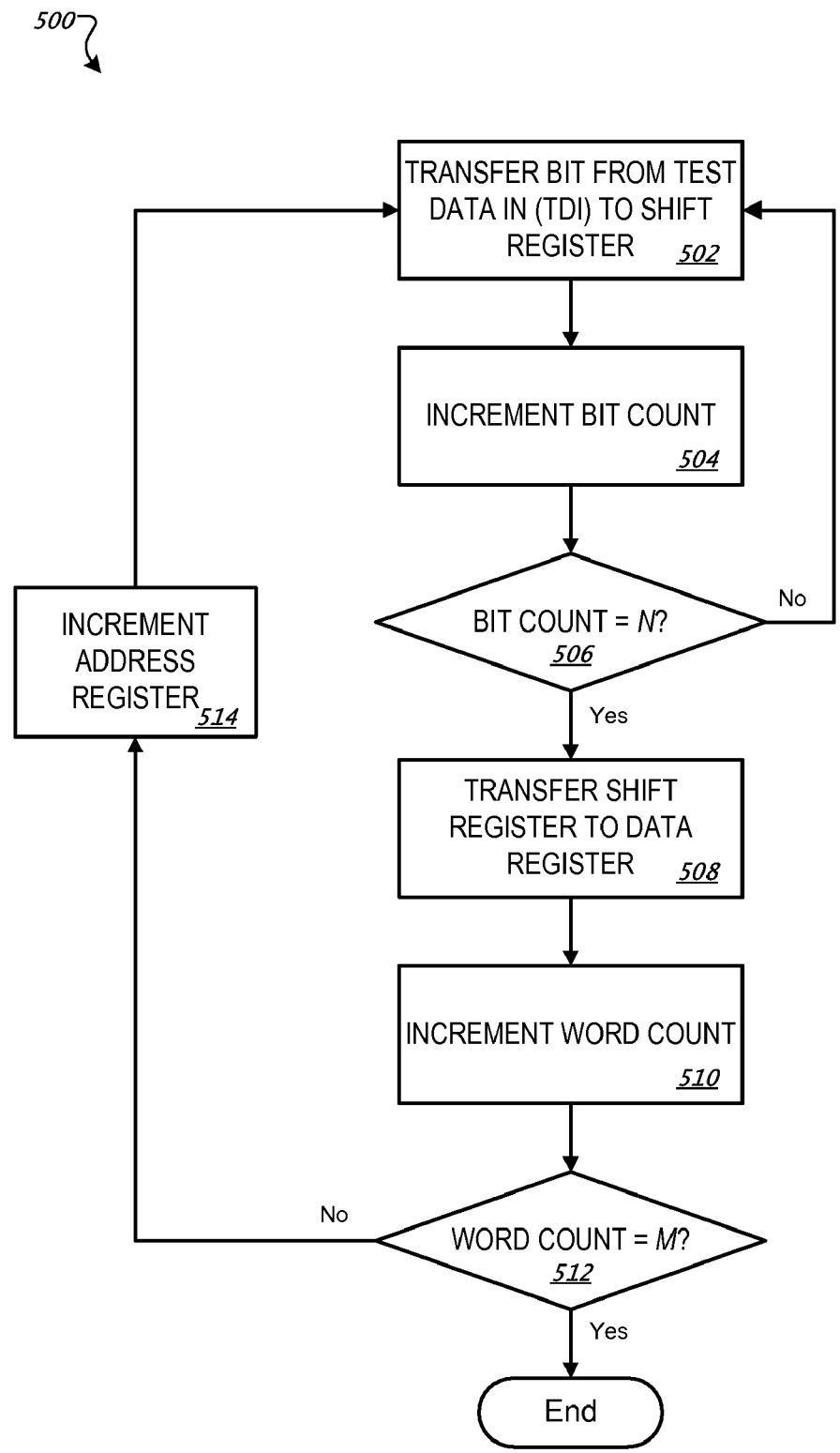
FIG. 5 is a flowchart of an example method for writing a block of sequential data to memory.

FIG. 5 is a flowchart of an example method 500 for writing a block of sequential data to memory. The method 500 writes M number of N bit words. The method will be described with reference to a system implementing the method.

Prior to the start of the method an initializing transfer loads the address register 410 with the starting address in memory where the transferred data is to be written. The initializing transfer also loads the size register 408 with the size of the words to be transferred (e.g., 8-bit, 16-bit, 32-bit, etc.) and the transfer direction register to indicate a memory write operation.

The method 500 begins with the transfer of a bit from TDI 418 to the shift register 402 (502). A bit count keeps track of the number of bits shifted into the shift register 402. The bit count is incremented (504). If the bit count is not equal to the number of bits in the word (N bits) (506), the method continues to 502 and transfers the next bit from TDI 418 into the shift register 402. If a complete word has been transferred (the bit count is equal to the word size (N bits)) (506), the contents of the shift register 402 are transferred to the data register 412 (508). A word count keeps track of the number of words written to memory. The word count is incremented (510). The word count is checked to see if it is equal to the block size (M words as determined by the JTAG master) (512). If the word count is not equal to M, the address register 410 is incremented to address the next location in memory to be written (514). If the word count is equal to M, writing of the block of data to memory is complete.

The method 500 writes a block of data to memory where the latency, if any, of the memory written is less than the bandwidth of the system 400.

Waveforms Illustrating the Writing of a Block of Sequential Data

Figure 6:
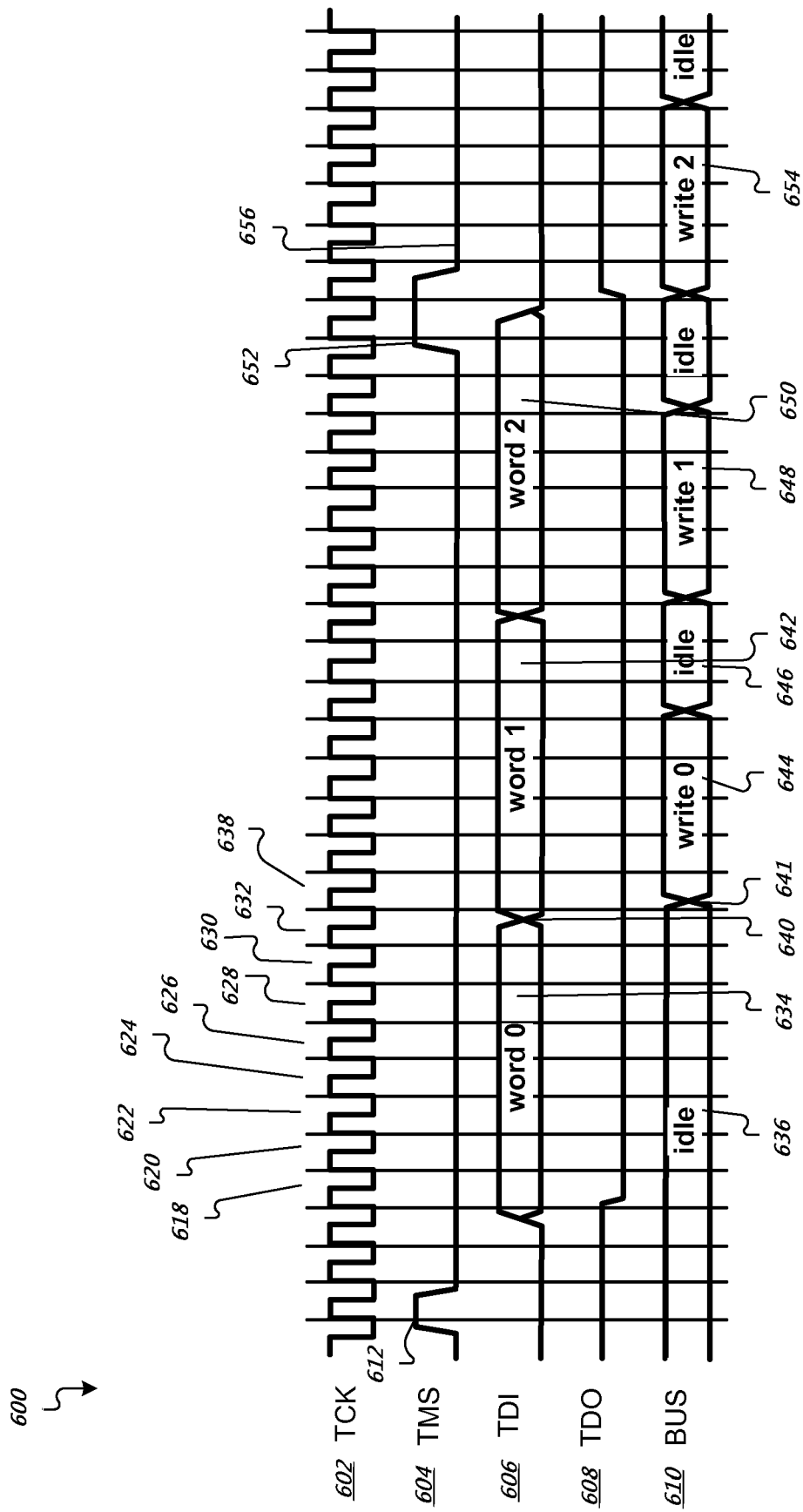
FIG. 6 is a diagram of example waveforms for transferring of a block of sequential data to memory.

FIG. 6 is a diagram of example waveforms 600 for transferring a block of sequential data to memory. The waveforms 600 illustrate the transfer of three 8-bit words to memory using a MEMORY_STREAM_ACCESS instruction. The waveforms 600 include signals between the JTAG TAP controller 128 and the bus interface module 126, of FIG. 1. The JTAG TAP controller 128 can receive signals from the JTAG port 130 for controlling the JTAG state machine in order to write the three 8-bit data words to memory.

The example waveforms 600 can represent signal activity within the system 400 and the following description uses the system 400 as the basis for describing the waveforms 600. However, another system, or combination of systems, may generate the signals represented by the waveforms 600.

The signals of the JTAG TAP controller 128 include TCK 602, TMS 604, TDI 606, and TDO 608. BUS signal 610 shows the state of the bus 124 during the data transfer. The TMS signal 604 can control state transitions in the JTAG state machine, and the TCK signal 602 can drive the state transitions in the JTAG state machine.

Operation of the MEMORY_STREAM_ACCESS instruction in write mode begins when the JTAG master enters the Shift-DR state in the TAP controller by, for example, holding TMS high for one clock cycle and TMS low for the next two clock cycles. When the TAP state machine is in the Shift-DR state, at clock cycle 618, the transfer of word 0 634 from the JTAG master begins with the transfer of the first bit of the 8-bit word from TDI 606 into the shift register 402. The shifting of each consecutive bit of word 0 634 from TDI 606 into the shift register 402 occurs from clock cycle 618 through clock cycle 632, one bit per clock cycle. Concurrent with the first bit of word 0 634 shifting into the shift register 402, TDO 608 transitions to a low level and remains low so long as the bus interface is not busy. The BUS 610 remains in an idle mode 636 until the complete transferring of word 0 634 into the shift register 402 occurs.

Clock cycle 638 begins the writing of word 0 634 (write 0 644) to memory indicated by the BUS signal 610. A delay equivalent to, for example, approximately half of a clock cycle exists between the completion of the transfer of word 0 to the shift register (640) and the start of write 0 (641). During this time, the control logic 406 initiates the transfer of the shift register 402 to the data register 412. Write 0 644 begins, and the shift register 402 is available to accept the next word to write to memory from the JTAG master. While word 1 642 transfers into the shift register 402, word 0 634 is written to memory (write 0 644) as indicated by the signals on the BUS 610.

Waveforms 600 show the BUS 610 entering an idle mode 646 after write 0 644 and before write 1 648 (the writing of word 1 642 to memory). This indicates that the writing of the memory has occurred at a faster rate than the transfer of the data into the shift register 402. This permits a JTAG compliant system implementing the MEMORY_STREAM_ACCESS instruction to operate at close to 100% of its available bandwidth without introducing delays when writing data to memory.

The TAP state machine will move to Run-Test/Idle when the last bit of the last word (e.g., word 2 650) transfers into the shift register 402. In some implementations, TMS will be high for one cycle and then stay low until Run-Test/Idle has been reached. When leaving Shift-DR, TDO 608 transitions back to a tri-state level, as specified in the JTAG specification. The bus interface will write the last word (e.g., word 2 650) as soon as all the bits are transferred.

Method for Writing a Block of Sequential Data with Feedback

Figure 7:
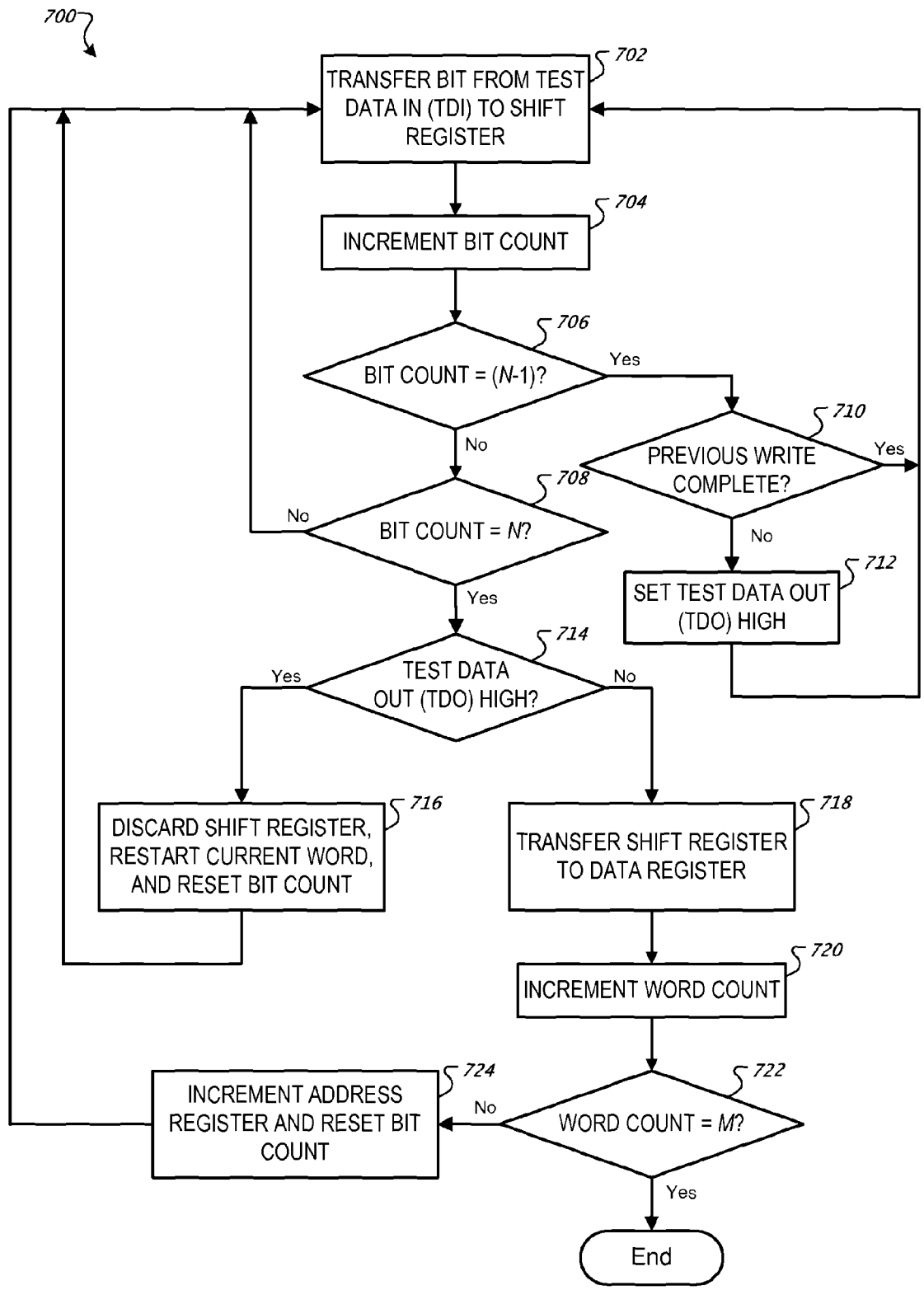
FIG. 7 is a flowchart of an example method for transferring a block of sequential data with feedback.

FIG. 7 is a flowchart of an example method 700 for transferring a block of sequential data with feedback. The method 700 writes M number of N bit words. The method is described with reference to a system performing the method, for example, the system 400. However, another system, or combination of systems, may be used to perform the method 700.

The initializing transfer can be performed to load the size register 408 with the size of the words to be transferred (e.g., 8-bit, 16-bit, 32-bit, etc.), and to load the transfer direction register to indicate that a memory write is to occur. The method 700 begins with the transfer of one bit from TDI 418 into the shift register 402 (702). A bit count keeps track of the number of bits shifted into the shift register 402. The bit count is incremented (704). The bit count is checked to see if it is equal to one less than the number of bits in the word (N−1) (706). If the bit count is not equal to N−1, the bit count is checked to determine if it is equal to the number of bits in the word (N bits) (708). If the bit count is not equal to N, the method continues to 702 and transfers the next bit from TDI 418 into the shift register 402.

If the bit count is equal to N−1 at 706, a check is made to determine if the previous data word has been written to memory (710). If the previous write is complete, the method continues to 702 and transfers the next bit from TDI 418 into the shift register 402. If the previous write is not complete (710), TDO 416 is set high (712) to indicate the previous write is in progress. The method 700 continues to 702.

If the bit count is equal to N (708), the transfer of the word to the shift register 402 is complete. The system checks if TDO 416 is set high (714). If TDO 416 is high, the write of the previous data word is still in progress indicating that the contents of the shift register 402 are not to be transferred to the data register 412. In some implementations, the contents of the shift register 402 are discarded and the bit count is reset (716). A MEMORY_STREAM_ACCESS compatible JTAG master can respond by repeating the transfer of the same data word. The method 700 continues to 702 where the transfer of the same data word from the JTAG master into the shift register 402 restarts.

If TDO 416 is not high at 714, the shift register 402 is transferred to the data register 412 (718). A word count keeps track of the number of words written to memory. The word count is incremented (720), and the word count is checked to see if it is equal to the block size (M words as determined by the JTAG master) (722). If the word count is not equal to M, the address register 410 is incremented to address the next location in memory (724). The method 700 continues to step 702. If the word count is equal to M, writing of the block of data to memory is complete.

The method 700 uses TDO 416 to provide feedback to a JTAG master in cases where the time required to write data to a memory address is uncertain. The control logic 406 outputs a busy status on TDO 416, which is read by the JTAG master. The JTAG master responds by repeating the current word.

Figure 8:
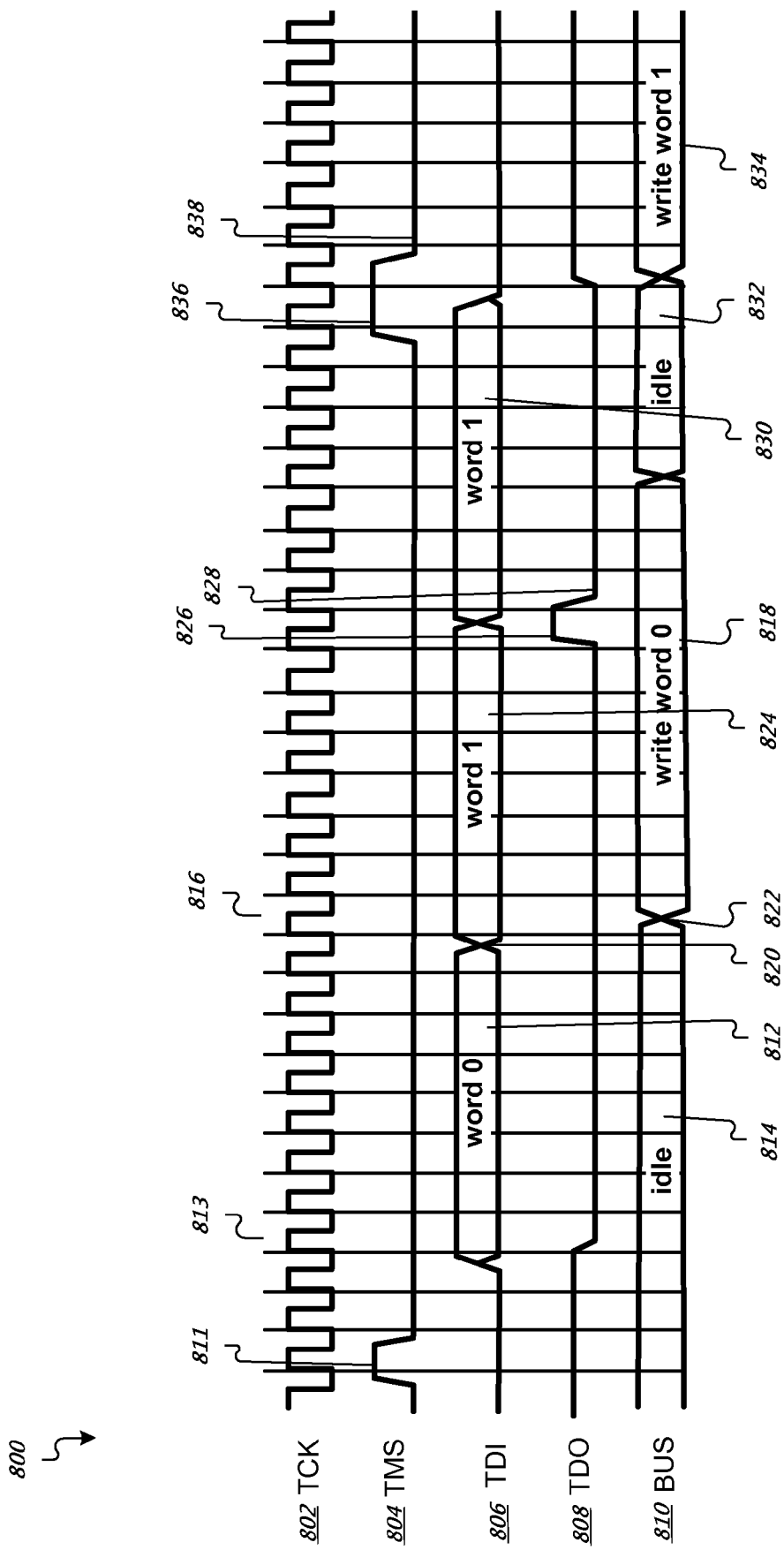
FIG. 8 is a diagram of example waveforms for transferring a block of sequential data with feedback.

Waveforms Illustrating the Writing of a Block of Sequential Data with Feedback FIG. 8 is a diagram of example waveforms 800 for transferring a block of sequential data to memory with feedback. The waveforms 800 illustrate the data transfer of two 8-bit words to memory using a MEMORY_STREAM_ACCESS instruction in a write mode. The waveforms 800 include signals between the JTAG TAP controller 128 and the bus interface module 126, of FIG. 1, for example. The JTAG TAP controller 128 can receive signals from the JTAG port 130 to control the JTAG state machine in order to write two 8-bit words to memory. The waveforms 800 are described with reference to the system 400. However, another system, or combination of systems, may generate the signals represented by the waveforms 800.

The signals of JTAG TAP controller 128 include TCK 802, TMS 804, TDI 806, and TDO 808. BUS signal 810 shows the state of the bus 124 during the data transfer.

Operation of a MEMORY_STREAM_ACCESS instruction in write mode begins, for example, when the JTAG master enters the Shift-DR state in the TAP controller by, for example, holding TMS high for one clock cycle and TMS low for the next two clock cycles. When the TAP state machine is in the Shift-DR state, at clock cycle 813, the transfer of word 0 812 from the JTAG master begins. Substantially concurrent with the first bit of word 0 812 shifting into the shift register 402, TDO 808 transitions from a tri-state level to a low level and remains low as long as the bus interface is not busy. The bus 810 remains in an idle mode 814 until the transfer of word 0 812 into the shift register 402 is complete.

Clock cycle 816 begins the writing of word 0 812 (write word 0 818) to memory indicated by the BUS signal 810. In some implementations, a delay equivalent to approximately half of a clock cycle exists between the completion of the transfer of word 0 into the shift register (820) and the start of write word 0 (822). During this time, the control logic 406 initiates the transfer of the shift register 402 to the data register 412. Write word 0 818 begins and the shift register 402 is available to accept the next word to write to memory from the JTAG master. While word 1 824 transfers into the shift register 402, word 0 812 is written to memory (write word 0 818) as indicated by the signals on the BUS 810.

Waveforms 800 show the BUS 810 continuing to write word 0 into memory (write word 0 818) when the transfer into the shift register 402 of the second to last bit of word 1 824 occurs. Therefore, TDO 808 transitions from low to high (826) to indicate that the writing of the previous word (write word 0 818) into memory is still in progress. TDO 808 remains high until the re-transfer of word 1 830 into the shift register 402 begins. TDO 416 then transitions back low (828). The writing of word 0 (write word 0 818) into memory continues while word 1 830 is transferred again into the shift register 402. The BUS 810 enters an idle mode 832 when write word 0 818 completes, and before write word 1 834 begins.

In some implementations, the TAP machine will move to Run-Test/Idle when the last bit of the last word (e.g., word 1 830) transfers into the shift register 402. In some implementations, TMS will be high for one clock cycle and then stay low until Run-Test/Idle has been reached. When leaving Shift-DR, TDO 808 transitions back to a tri-state level, as specified in the JTAG specification. The bus interface will write the last word (word 1 in this example) as soon as all of the bits are transferred.

System for Reading a Block of Sequential Data

Figure 9:
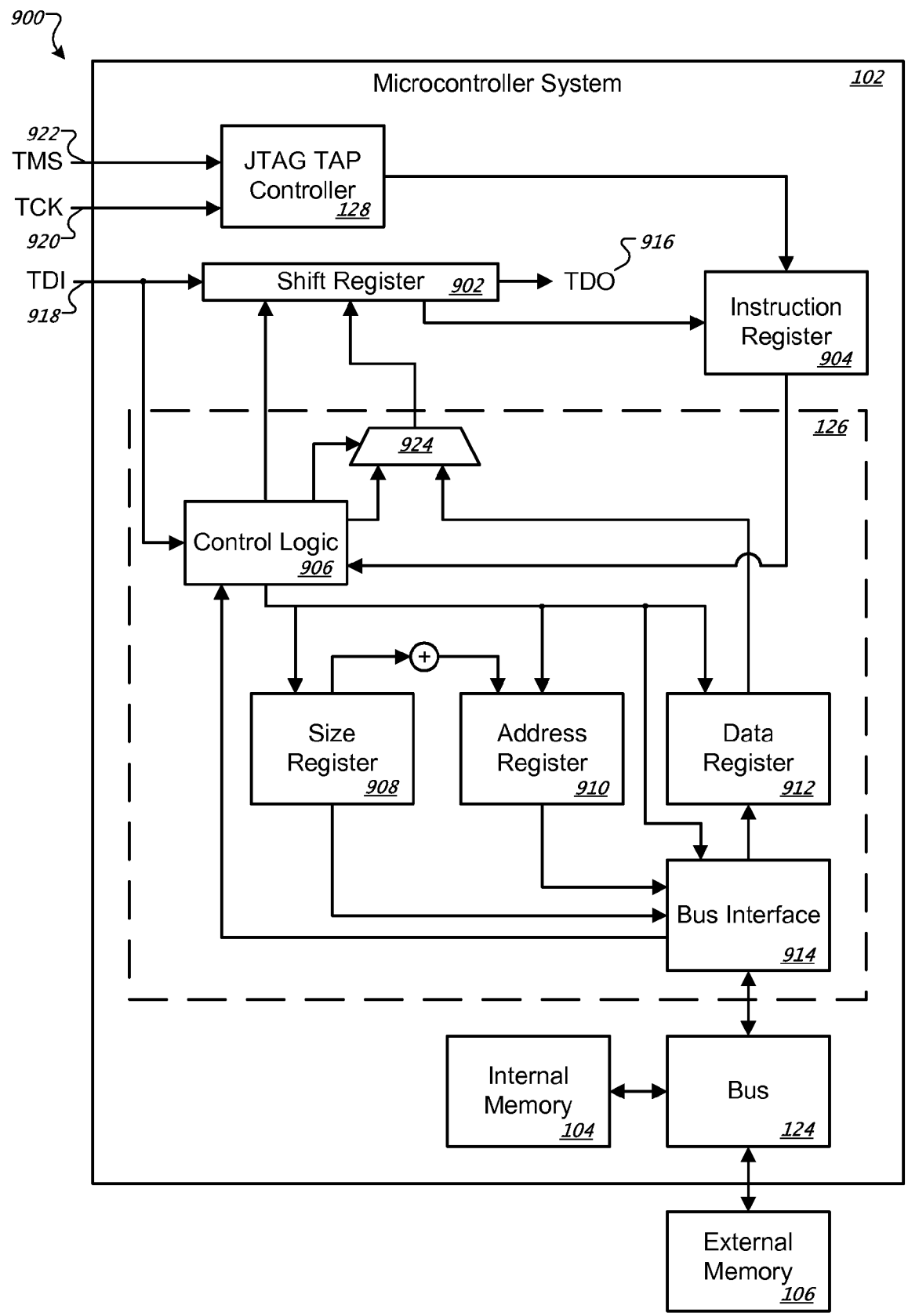
FIG. 9 is a block diagram of an example system for reading a block of sequential data in a microcontroller system.

FIG. 9 is a block diagram of an example system 900 for reading a block of sequential data in a microcontroller system 102. The system 900 shows an implementation of a JTAG bus interface supporting a MEMORY_STREAM_ACCESS read operation. Although the system 400 and the system 900 are described as independent systems to simplify the present disclosure, in some implementations, a composite system supports both read and write MEMORY_STREAM_ACCESS operations, with the control logic determining the mode of operation depending on a value in a direction register.

The system 900 includes internal memory 104 and a bus 124. The bus 124 can also interface with external memory 106. The bus 124 controls the reading of data from both the internal memory 104 and the external memory 106. The bus interface module 126 includes control logic 906, a size register 908, an address register 910, a data register 912, and a bus interface 914. The control logic 906 can control the MEMORY_STREAM_ACCESS read operation.

An initializing transfer loads the size register 908 with the size of the words to be read (e.g., 8-bit, 16-bit, 32-bit, etc.) The initializing transfer also loads the starting address of the memory to be read into the address register 910 and loads a transfer direction register (not shown) to indicate operation in a read (rather than a write) mode.

The system 900 includes the JTAG TAP controller 128, a shift register 902, TDO 916, and an instruction register 904. The JTAG TAP controller 128 includes a JTAG state machine such as the state machine described with reference to FIG. 2. The shift register 902 can convert parallel data from the data register 912 to serial output on TDO 916.

The system 900 can use TDI 918 and TDO 916 for serial access to the instruction register 904 and the data register 912 in the Shift-IR 214 and Shift-DR 210 states, respectively. The instruction register 904 can decode the MEMORY_STREAM_ACCESS instruction, as well as other instructions, that the system 900 can use to load one or more registers.

An initializing transfer can load values into the address register 910, the size register 908, and a direction register (not shown), for example, prior to the MEMORY_STREAM_ACCESS instruction being issued. Conventional JTAG instructions can be used to capture the data at the address indicated by the address register into the data register through operation of the JTAG state machine. The MEMORY_STREAM_ACCESS instruction can then be issued (by, for example, loading the instruction into the instruction register 904) and data transfer from the data register to the shift register begins. This ensures that the data register 912 holds valid data to capture into the shift register 902 in the Capture-DR state 220 before entering the Shift-DR 210 state.

Upon entering the Shift-DR state 210, the JTAG master can begin to shift out the first word read from memory on TDO 916. The transfer of a word (N bits) from the data register 912 to the shift register 902 occurs, and the address register 910 is incremented to the next memory location. A new bus transfer (memory read) is performed, and the data resulting from the memory read is placed in the data register 912. Transfer of the data register 912 to the shift register 902 can occur once the previous data word (N bits) in the shift register 902 transfers out to the JTAG master on TDO 916. This can occur without leaving the Shift-DR state 210 of the JTAG state machine.

The read operation continues until the complete block of data (M words as determined by the JTAG master) is transferred. The bits in the data register 912 are transferred to the shift register, and the JTAG master serially transfers the contents of the shift register 902 out on TDO 916. The control logic 906 can count the number of TCK 920 cycles, and activate data transfers at regular intervals according to the size of the data words being transferred. A MEMORY_STREAM_ACCESS compatible JTAG master can use the data register 412 a virtual N*M bit shift register, where M is the number of words in the data transfer as determined by the JTAG master and N is the number of bits per word.

If the system 900 executes a MEMORY_STREAM_ACCESS instruction in a read mode using high latency memory, the ongoing read operation may not complete by the time the JTAG master reads the previous word from the shift register 902 on TDO 916. In some implementations the MEMORY_STREAM_ACCESS instruction in a read mode provides feedback to report the status of the last read. The feedback can indicate to the JTAG master whether the shift register 902 holds valid data. During a MEMORY_STREAM_ACCESS data transfer the JTAG state machine remains in the Shift-DR state 210, and the feedback information can be interleaved with the output data stream on TDO 916.

Feedback can be provided in the form of a special data word inserted into the output stream. In some implementations, this special word includes an escape sequence recognized by a compatible JTAG master. The control logic 906, using multiplexer 924, can control whether the data register 912 or an escape sequence provided by the control logic 906 is transferred to the shift register 902. In some implementations, a data word transferred into the shift register 902 immediately after the escape sequence can include information related to the cause of the escape event, and be transferred to the shift register 902 from the control logic 906. This can include a code indicating a busy state (i.e., the previous access is not complete and the JTAG debugger can, for example, continue to poll the data word in the shift register).

The data word transferred into the shift register 902 immediately after the escape sequence can also include a code indicating an error (i.e., the previous memory access terminated with an error), or a code indicating that the escape sequence incidentally occurred in the data stream. Any sequence can be used as the escape sequence, however, performance may be enhanced by selecting an escape sequence that occurs infrequently in the data stream.

Method for Reading a Block of Sequential Data

Figure 10:
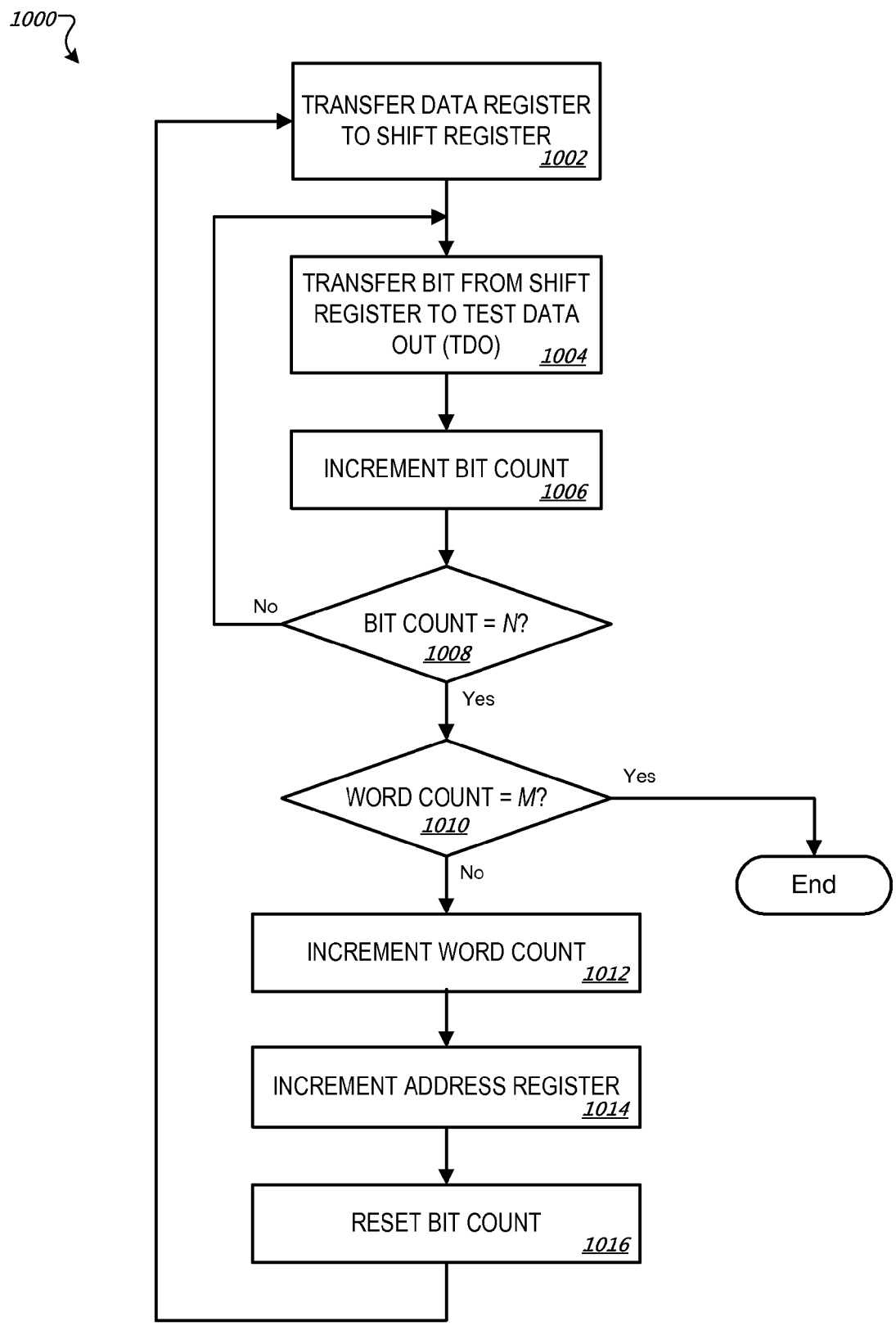
FIG. 10 is a flowchart of an example method for reading a block of sequential data from memory.

FIG. 10 is a flowchart of an example method 1000 for reading a block of sequential data from memory. The method 1000 can read M number of N bit words. The method 1000 will be described with reference to a system implementing the method, for example, the system 900. However, another system, or combination of systems, can be used to perform the method 1000.

An initializing transfer loads the size register 908 with the size of the words to be read from memory (e.g., 8-bit, 16-bit, 32-bit, etc.), and loads the transfer data direction to indicate a memory read will occur. The method 1000 begins with the transferring the data register 912 to the shift register 902 (1002). Once the transfer is complete, the system transfers one bit from the shift register 902 to TDO 916 (1004). The system increments the bit count (1006), and checks the bit count to determine if it is equal to the number of bits in a word (N bits) (1008). If the bit count is not equal to N, the method continues to 1004 and another bit is transferred from the shift register 902 to TDO 916.

If the bit count is equal to N, the system checks to see if a word count is equal to the block size (M words as determined by the JTAG master) (1010). The word count tracks the number of words read and shifted into the shift register 902. If the word count is not equal to M, it is incremented (1012), and the address register 910 is also incremented (1014) to point to the next memory location to read. The bit count is reset (1016), and the method continues to 1002. The method ends if the word count is equal to M at 1006.

Waveforms Illustrating the Reading of a Block of Sequential Data

Figure 11:
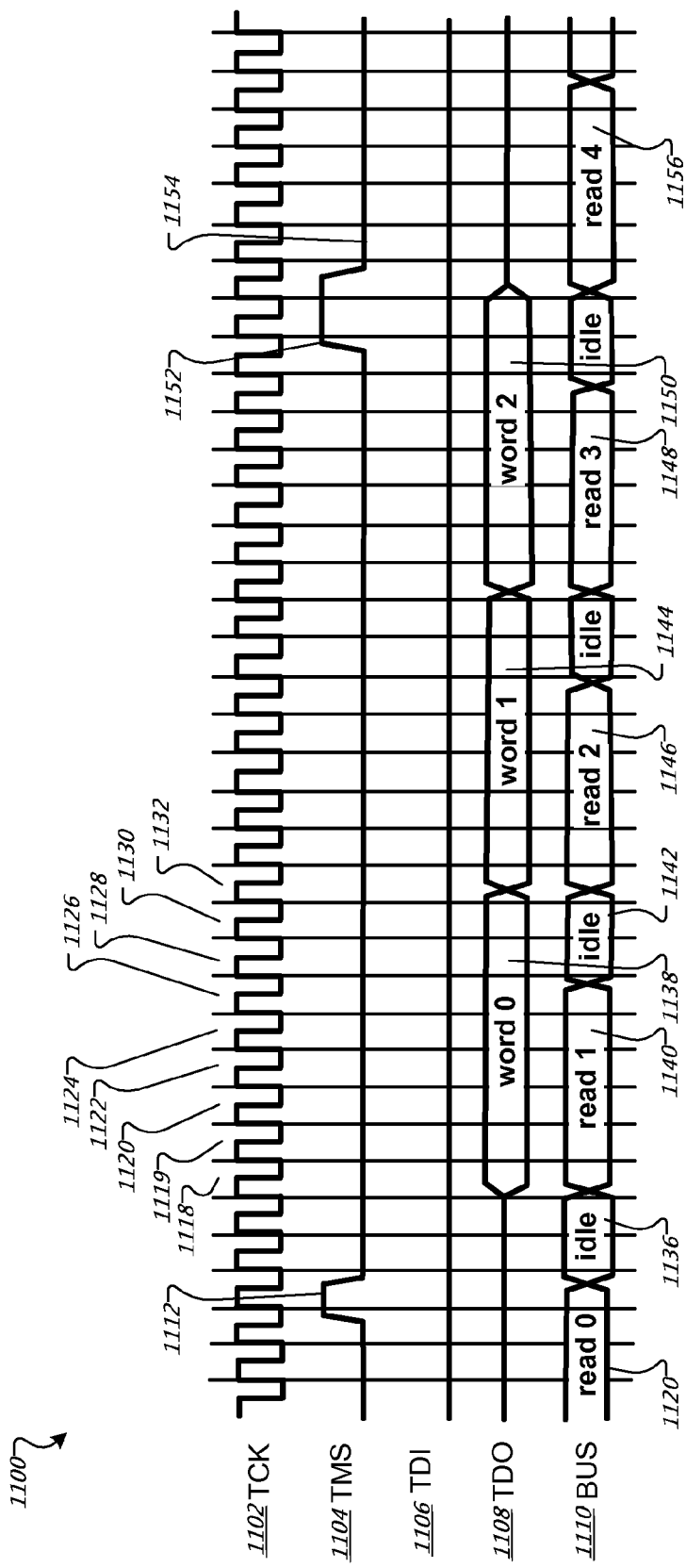
FIG. 11 is a diagram of example waveforms for reading a block of sequential data from memory.

FIG. 11 is a diagram of example waveforms 1100 for reading a block of sequential data from memory. The waveforms 1100 illustrate the data transfer of three 8-bit words from memory using a MEMORY_STREAM_ACCESS instruction. The waveforms 1100 include signals between the JTAG TAP controller 128 and the bus interface module 126 of FIG. 1. The JTAG TAP controller 128 can receive signals from the JTAG port 130 to control the JTAG state machine in order to perform the MEMORY_STREAM_ACCESS operation. Waveforms 1100 represent signal activity that occurs, for example, in the system 900 during a MEMORY_STREAM_ACCESS read operation. The description that follows uses the system 900 as the basis for describing the waveforms 1100. However, another system, or combination of systems, may generate the signals represented by the waveforms 1100.

The signals received from the JTAG port 130 at the JTAG TAP controller 128 include TCK 1102, TMS 1104, TDI 1106, and TDO 1108. BUS signal 1110 shows the state of the bus 124 during the data transfer. The TMS signal 1104 can control state transitions in the JTAG state machine, and the TCK signal 1102 can drive the state transitions in the JTAG state machine.

The MEMORY_STREAM_ACCESS read operation begins when the JTAG master enters the Shift-DR TAP state by, for example, setting TMS high for one clock cycle and low for the next two clock cycles. The control logic 906 transfers the data register 912 to the shift register 902. Two clock cycles later, at clock cycle 1118, the JTAG master begins the transfer of word 0 1138 from TDO 1108, on a bit-by-bit basis. The shifting of each consecutive bit of word 0 1138 from TDO 1108 to the JTAG master can occur from clock cycle 1118 through clock cycle 1130 (one bit per clock cycle). Read 0 1120 represents the last read data value from bus 124 that is in data register 912.

The BUS 1110 is in an idle mode 1136 until the transfer of read 0 1120 from the data register 912 into the shift register 902 begins. The start of clock cycle 1118 begins the transfer of word 0 1138 to the JTAG master. The bus then reads the next word in memory which is transferred to the data register 912. While word 0 1138 is being transferred out of the shift register 902 on TDO 1108, the next word in memory, read 1 1140, can be read by the bus as indicated by the signals on BUS 1110. The same cycle follows for the reading of read 2 1146 and the transfer of word 1 1144.

Waveforms 1100 show the BUS 1110 entering an idle mode 1142 after read 1 1140 and before word 1 1144 (the shifting out, on TDO 1108, of read 1 1140). There is an idle state in the example shown due, for example, to the memory being read at a faster rate than data is transferred out of the shift register.

TMS 1104 transitions high 1152 before the last bit of the last word to transfer (word 2 1150) is shifted out to TDO 1108 to exit the Shift-DR TAP state. TMS 1104 transitions low 1154 after one clock cycle and stays low to reach the Run-Test/Idle TAP state (the last bit shifts out of the shift register 902 to TDO 1108). The BUS 1110 can continue to read memory, as indicated by read 4 1156.

Method for Reading a Block of Sequential Data with Feedback

Figure 12:
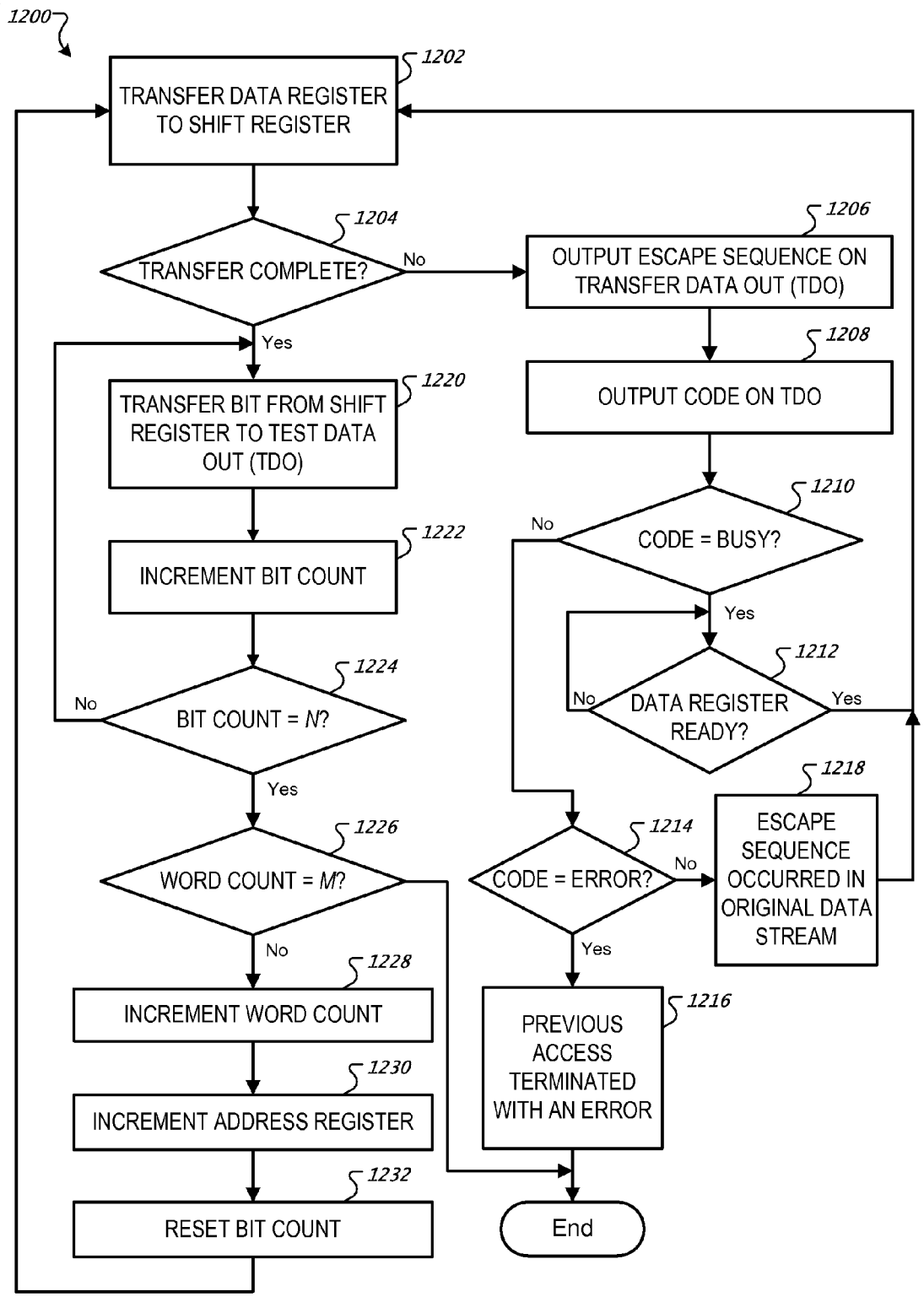
FIG. 12 is a flowchart of an example method for reading a block of sequential data with feedback.

FIG. 12 is a flowchart of an example method 1200 for a reading a block of sequential data with feedback. The method 1200 can read M number of N bit words. The method will be described with reference to a system performing the method, the system 900, for example. However, another system, or combination of systems, can be used to perform the method 1200.

An initializing transfer loads the address register 910 with the starting address in memory to read, loads the size register 908 with the size of the words to be read, (e.g., 8-bit, 16-bit, 32-bit, etc.), and loads the transfer direction register to indicate a memory read operation is to be performed. The contents of the data register 912 are transferred to the shift register 902 (1202). The system checks to determine if the transfer is complete (1204). If the transfer did not complete, the control logic 906 inserts, for example, a special word that includes an escape sequence into the shift register in place of the next word. The escape sequence transfers out on TDO 916 to the JTAG master (1206). The word transferred into the shift register immediately after the escape sequence can include a code indicating information about the cause of the escape event. The word transfers out on TDO 916 to the JTAG master (1208). The system reads the code to determine if it indicates busy (1210). If the code indicates busy, the previous read access is still in progress, and the system continues to poll the shift register until the data word is in the data register ready for transfer to the shift register (1212). When the word is available in the data register, the method continues to 1202.

If the code does not indicate busy (1210), the code is checked to see if it indicates an error (1214). If the code indicates error, the previous memory access terminated with an error (1216), and the method 1200 ends. If the code does not indicate an error (1214), the code is checked to determine if the escape sequence incidentally occurred in the original data stream and should be handled as data (1218).

If the data transfer from the data register to the shift register is complete (1204), the system transfers a bit from the shift register 902 to TDO 916 (1220) and increments the bit count (1222). The system checks the bit count to determine if the bit count is equal to the number of bits in a word (N bits) (1224). If the bit count is not equal to N, the method 1200 continues to 1220 and another bit is transferred from the shift register 902 to TDO 916.

If the bit count is equal to N (1224), the system checks if the word count is equal to M as determined by the JTAG master (1226). The word count keeps track of the number of words shifted into the shift register 902. If the word count is not equal to M, the word count is incremented (1228). The address register 910 is incremented (1230) to point to the next memory location to read, and the bit count is reset (1232). The method 1200 ends if the word count is equal to M (1226).

The feedback mechanism of the method 1200 permits the reading of a block of sequential data in a system having high latency memory. The control logic 906 outputs an escape sequence into the shift register as feedback to indicate to a compatible JTAG master that the next word to read is not yet available in the data register 912.

Waveforms Illustrating the Writing of a Block of Sequential Data with Feedback

Figure 13:
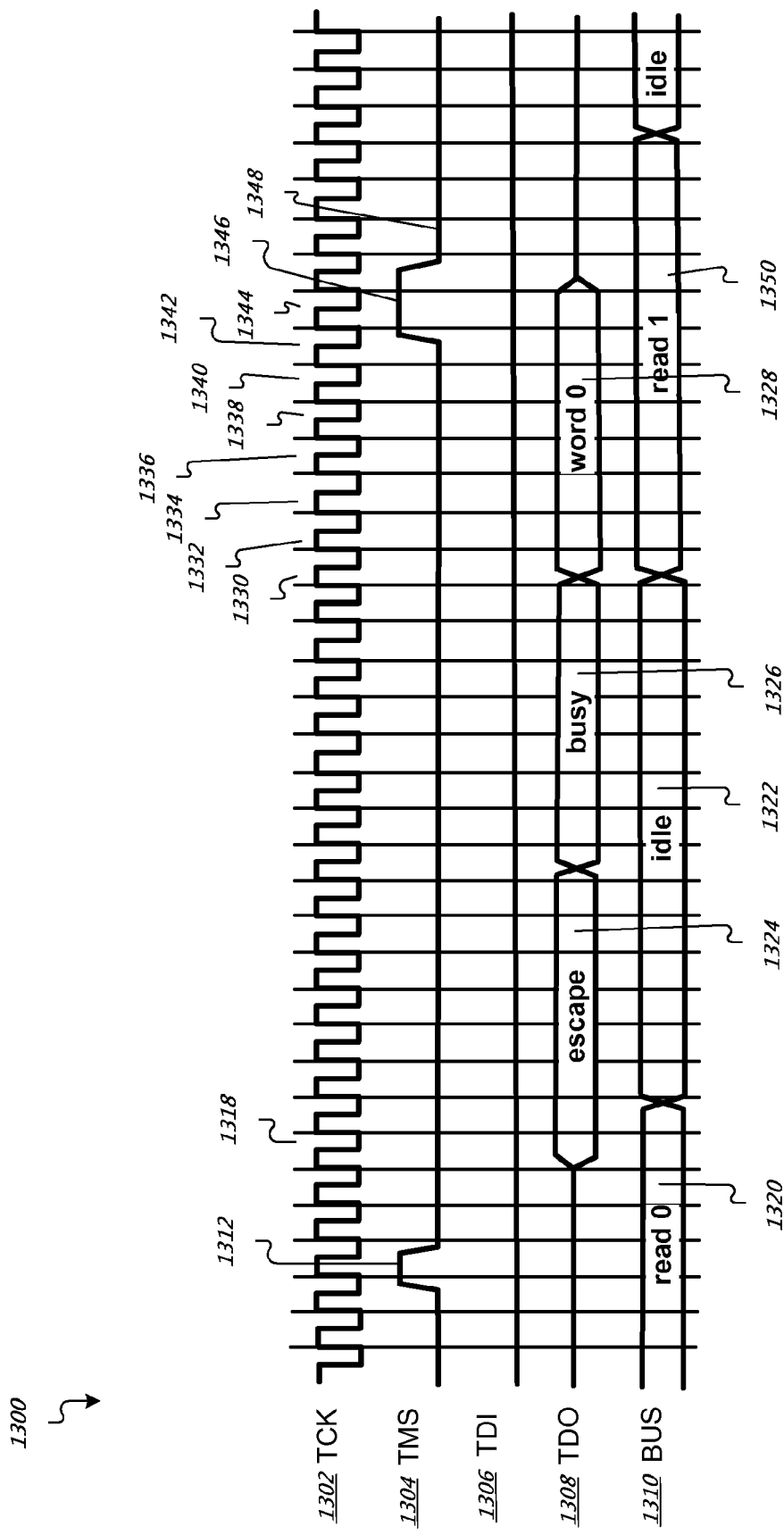
FIG. 13 is a diagram of example waveforms for reading a block of sequential data with feedback.

FIG. 13 is a diagram of example waveforms 1300 for reading a block of sequential data with feedback. The waveforms 1300 illustrate the transfer of one 8-bit word from memory using a MEMORY_STREAM_ACCESS instruction in a read mode. The waveforms 1300 include signals between the JTAG TAP controller 128 and the bus interface module 126 of FIG. 1, for example. The JTAG TAP controller 128 can receive signals from the JTAG port 130 to control the JTAG state machine in order to read the 8-bit word from memory.

Waveforms 1300 represent signal activity in a system performing a MEMORY_STREAM_ACCESS read operation, the system 900, for example. However, another system, or combination of systems, may generate the signals represented by the waveforms 1300.

The signals of the JTAG TAP controller 128 include TCK 1302, TMS 1304, TDI 1306, and TDO 1308. BUS signal 1310 shows the state of the bus 124 during the data transfer.

The TMS signal 1304 can control state transitions in the JTAG state machine, and the TCK signal 1302 can drive the state transitions. The MEMORY_STREAM_ACCESS read operation begins when the JTAG master enters the Shift-DR TAP state by, for example, setting TMS high for one clock cycle and low for the next two clock cycles. Two clock cycles later, at clock cycle 1318, the control logic 906 transfers an escape sequence 1324 to the shift register 902 to indicate that the data word, read 0 1320, is not available for transfer from the data register 912 to the shift register 902 at that point in time. Once the transfer of the escape sequence is complete, the next word transferred by the control logic 906 is a code indicating the cause of the escape sequence being transmitted. In this example, the control logic transmits a busy code 1326 (one data word in size) into the shift register. The busy code 1326 in the shift register 902 is transferred on a bit-by-bit basis (one bit per clock cycle) on TDO 1308 to the JTAG master. The busy code 1326 indicates that the previous memory read is still in progress. During the transfer of the escape sequence 1324 and the busy code 1326, the memory read (read 0 1320) is shown having completed, and the bus 124 is shown in an idle mode 1322.

Following the transfer of the busy code 1326 on TDO 916, the control logic 906 transfers the data register 912 to the shift register 902. The data register 912 holds the data word, read 0 1320, and the transfer of word 0 1328 out of the shift register begins. The shifting of each consecutive bit of word 0 1328 out of the shift register occurs from clock cycle 1330 through clock cycle 1344, one bit per clock cycle.

TMS 1304 transitions high 1346 when the shift register 902 is transferring the last bit of the last data word out on TDO 1308 to exit the Shift-DR TAP state. TMS 1304 transitions low after one clock cycle and stays low to reach the Run-Test/Idle TAP state (the last bit shifts out of the shift register 902 on TDO 1308 to the JTAG master). The BUS 1310 can continue to read memory, as indicated by read 1 1350.

General System Issues and Improvements

The disclosed MEMORY_STREAM_ACCESS operations can contribute to increased bandwidth in a JTAG based debugging system for a microcontroller. Transfer efficiency for system 400 and system 900, of FIG. 4 and FIG. 9 respectively, can be calculated based on the number of bits transferred per cycles used. For example, the JTAG protocol can use three clock cycles to put the JTAG state machine into the Shift-DR state and two clock cycles to exit the Shift-DR state. As described with reference to FIG. 4 and FIG. 9, the JTAG state machine does not leave the Shift-DR state for the duration of the memory block transfer. The transfer efficiency of a system that utilizes 32-bit words when transferring 1024 words is then:

$$(32*1024)/(3+32*1024+2)=0.9998474 \approx 100\%$$

(approximately 2.5 Mbytes per second at 20 MHz). This transfer efficiency approaches 100% for both memory read and memory write operations.

In some implementations, internal memory in microcontrollers can be less than 1 Mbyte in size. Based on the calculations above, the 1 MByte of memory can completely transfer in approximately 400 milliseconds. This speed can be desirable in programming, as well as production test and debugging situations.

The systems 400 and 900 can increase the bandwidth of a block memory transfer to substantially close to 100% of the JTAG system bandwidth (bits per TCK cycle). A complete transfer of a block of memory can occur without altering the TAP state of the JTAG state machine. Other systems may transfer a block of data to and from memory one word at a time, requiring multiple passes through several branches of the JTAG state machine, altering the TAP state for each transfer. In these systems the JTAG master transfers a new address for each memory access, which can reduce the JTAG system bandwidth to less than 50%.

Various modifications may be made to the disclosed implementations and still be within the scope of the following claims.

What is claimed is:

1. A method comprising:
    transitioning a state machine into a state;
    transferring M data words, each having N data bits, from an external device to a sequential block of microcontroller accessible memory, the transferring including:
    for each of the M data words:
        transferring the N data bits of the data word from the external device at a data input line to a multiple bit shift register of a testing interface that includes the state machine;
        transferring the data word from the multiple bit shift register to a data register of the testing interface after the N data bits have been transferred from the data input line to the multiple bit shift register;
    writing the contents of the data register to a memory address indicated by a location value in an address register of the testing interface; and
    incrementing the location value in the address register to a next memory location in the microcontroller accessible memory for writing a next data word from the M data words, the location value being incremented by a value that represents N, wherein M and N are integers, and
    wherein the M data words are transferred to the microcontroller accessible memory while the state machine remains in the state.

2. The method of claim 1, further comprising:
    providing, during the transfer of each of the M data words to the microcontroller accessible memory, a word transfer status specifying whether the N bits of the data word have been written to the memory address;
    preventing the transferring of a next word from the M data words from the multiple bit shift register to the data register while the word transfer status specifies a busy status.

3. The method of claim 1, wherein:
    the state of the state machine is a shift-DR state.

4. The method of claim 1, wherein:
    M equals a size, in data words, of a data block being transferred from the external device to the microcontroller accessible memory.

5. The method of claim 1, wherein N equals a bit size of a data bus between the data register and the microcontroller accessible memory.

6. The method of claim 1, further comprising:
    prior to transferring the M data words from the external device to the microcontroller accessible memory,
    loading the address register with an initial location value; and
    loading a transfer direction register with a transfer direction indicator.

7. The method of claim 1, wherein transferring the M data words further includes:
    incrementing the location value in the address register following the writing of the contents of the data register to the memory address; and
    transferring a next word from the multiple bit shift register to the data register for writing to the memory address indicated by the incremented location value.

8. The method of claim 1, wherein performance of the method is controlled by a control logic supporting an IEEE 1149.1 instruction set and an extended instruction set including a sequential memory transfer instruction.

9. The method of claim 1, further comprising:
    transmitting, during the transferring of the M data words, a transfer status on a test data output line of the testing interface.

10. The method of claim 9, wherein transferring M data words from an external device to a sequential block of microcontroller accessible memory further includes:
    indicating a busy state for the transfer status if, after N minus one bits have been transferred to the multiple bit shift register from the data input line, a previous write from the data register to memory has not yet completed.

11. A method comprising:
    transitioning a state machine into a state;
    transferring M data words, each having N data bits, from microcontroller accessible memory to an external device including:
    for each of the M data words:
        transferring the data word from a memory address of the microcontroller accessible memory to a data register of a testing interface that includes the state machine, wherein the memory address is indicated by a location value in an address register of the testing interface;
        transferring the data word from the data register to a multiple bit shift register of the testing interface;
        transferring the N data bits from the multiple bit shift register to a data output line of the testing interface; and
        incrementing a location value in the address register for reading a next word from the microcontroller accessible memory, the location value being incremented by a value that represents N, wherein M and N are integers, and
    wherein the M data words are transferred to the external device while the state machine remains in the state.

12. The method of claim 11, wherein:
    the state of the state machine is a shift-DR state.

13. The method of claim 11, wherein:
    M equals a size, in data words, of a block of data being transferred from the microcontroller accessible memory to the external device.

14. The method of claim 11, wherein N equals a bit size of a data bus between the microcontroller accessible memory and the data register.

15. The method of claim 11, further comprising:
    prior to transferring the M data words from the microcontroller accessible memory to the external device,
    loading the address register with an initial location value;
    loading a transfer direction register with a transfer direction indicator; and
    transferring, from the microcontroller accessible memory to the data register, a first data word located at a memory address indicated by the initial location value.

16. The method of claim 11, wherein performance of the method is controlled by a control logic supporting an IEEE 1149.1 instruction set and an extended instruction set including a sequential memory transfer instruction.

17. The method of claim 11, further comprising:
transmitting, during the transferring of the M data words, an escape sequence in a test data output line of the testing interface to indicate a transfer status.

18. The method of claim 17, further comprising:
transmitting a data word without changing the state of the state machine and immediately following the escape sequence indicating a reason for the escape sequence being transmitted.

19. A system comprising:
a microcontroller system including microcontroller accessible memory;
a testing interface including a state machine; and
control logic adapted to recognize a sequential data transfer instruction and to selectively perform multiple sequential data write operations to, or multiple read operations from the microcontroller accessible memory, to transfer M data words during a shift-DR state, wherein each data write operation and each data read operation includes accessing a memory location of the microcontroller accessible memory without changing a state of the state machine from the shift-DR state.

20. The system of claim 19, wherein:
the control logic executes a sequential data write operation if a write operation is indicated by contents of a transfer direction register, the sequential data write operation comprising:
transitioning the state machine into a state;
transferring M data words, each having N data bits, from an external device to a sequential block of microcontroller accessible memory, the transferring including:
for each of the M data words:
transferring the N data bits of the data word from the external device at a data input line to a multiple bit shift register of the testing interface that includes the state machine;
transferring contents of the data word from the multiple bit shift register to a data register of the testing interface after a number the N data bits have been transferred from the data input line to the multiple bit shift register;
writing the contents of the data register to a memory address indicated by a location value in an address register of the testing interface; and
incrementing the location value in the address register to a next memory location in the microcontroller accessible memory for writing a next data word, wherein M and N are integers, and
wherein the M data words are transferred to the microcontroller accessible memory while the state machine remains in the state.

21. The system of claim 20, wherein:
the control logic executes a sequential data read operation if a read operation is indicated by contents of a transfer direction register, the sequential data read operation comprising:
transitioning the state machine into a state;
transferring M data words, each having N data bits, from microcontroller accessible memory to an external device by:
for each of the M data words:
transferring the data word from a memory address of the microcontroller accessible memory to a data register of the testing interface, wherein the memory address is indicated by a location value in an address register of the testing interface;
transferring the data word from the data register to a multiple bit shift register of the testing interface;
transferring the N data bits from the multiple bit shift register to a data output line of the testing interface; and
incrementing a location value in the address register for reading a next word from the microcontroller accessible memory, the location value being incremented by a value that represents N, wherein M and N are integers, and
wherein the M data words are transferred to the external device while the state machine remains in the state.

* * * * *